United States Patent [19]
Rapeli et al.

[11] Patent Number: 5,732,108
[45] Date of Patent: Mar. 24, 1998

[54] METHOD AND APPARATUS FOR PRODUCING A DIFFERENCE SIGNAL BETWEEN TWO SIGNAL FREQUENCIES, AND FOR DETECTION OF MODULATION

[75] Inventors: Juha Rapeli; Kari Kananen, both of Oulu, Finland

[73] Assignee: Nokia Mobile Phones Ltd., Salo, Finland

[21] Appl. No.: 521,640

[22] Filed: Aug. 31, 1995

Related U.S. Application Data

[63] Continuation-in-part of Ser. No. 200,623, Feb. 23, 1994, abandoned.

[30] Foreign Application Priority Data

Mar. 4, 1993 [FI] Finland .................................. 930973

[51] Int. Cl.[6] .................................................. H03D 3/18
[52] U.S. Cl. .................................... 375/316; 455/205
[58] Field of Search .................................. 375/237–239, 375/316, 328, 329, 334, 342, 355, 360, 361, 362, 364; 329/305–306, 310, 313–314; 355/205, 208, 209, 214

[56] References Cited

U.S. PATENT DOCUMENTS

| | | |
|---|---|---|
| 4,278,998 | 7/1981 | Miskin . |
| 4,584,693 | 4/1986 | Levy et al. .................... 375/281 |
| 4,785,255 | 11/1988 | Lucak et al. ................... 329/303 |
| 4,829,542 | 5/1989 | Shibano ......................... 375/280 |
| 5,003,553 | 3/1991 | Schluge et al. ................ 375/200 |
| 5,081,650 | 1/1992 | Hasegawa et al. ............. 375/324 |
| 5,122,758 | 6/1992 | Tomita .......................... 329/304 |
| 5,440,636 | 8/1995 | Herrick ...................... 375/200 X |

FOREIGN PATENT DOCUMENTS

| | | |
|---|---|---|
| 0170454 | 2/1986 | European Pat. Off. . |
| 88559 | 2/1993 | Finland . |
| 2451661 | 3/1980 | France . |
| 63-211915 | 9/1988 | Japan . |
| 3130177 | 2/1983 | Netherlands . |
| 2046543 | 11/1980 | United Kingdom . |
| WO 93/12578 | 6/1993 | WIPO . |

*Primary Examiner*—Young T. Tse
*Attorney, Agent, or Firm*—Perman & Green, LLP

[57] ABSTRACT

A frequency difference signal of a modulated signal ($f_1$) and an unmodulated signal ($f_2$) is produced maintaining the information of the frequency or phase modulation. According to the method, the time-related order of entry of the front edges of the pulses of the modulated and the unmodulated signal is controlled and the edge of the frequency difference signal in question at any moment is formed timewise at the same point as the edge of such modulated signal at which the time-related order of arrival of the modulating signal and the unmodulated signal has changed. Hereby, the frequency or phase shift of the modulated signal can be detected as an equivalent change in the frequency difference signal, and the modulation of the frequency difference signal is detected on the basis of the location of the pulse edge of the frequency difference signal.

17 Claims, 5 Drawing Sheets

METHOD AND APPARATUS FOR PRODUCING A DIFFERENCE SIGNAL BETWEEN TWO SIGNAL FREQUENCIES, AND FOR DETECTION OF MODULATION

CROSS-REFERENCE TO A RELATED PATENT APPLICATION

This patent application is a continuation-in-part of U.S. patent application Ser. No. 08/200,623, filed Feb. 23, 1994, now abandoned.

FIELD OF THE INVENTION

The present invention relates to a method and apparatus for down converting a modulated high-frequency signal to a lower frequency using a mixer, and detecting the modulation.

BACKGROUND OF THE INVENTION

In order to detect a modulated signal, the frequency of a carrier wave forming a received signal in a radio apparatus, such as in a radio phone, is decreased by one or two mixing phases such that it is sufficiently low for the frequency or phase deviation used in the modulation to be within the frequency or phase resolution range of the detector. For instance in the commonly known QPSK modulation (Quadrature Phase Shift Keying), a 90 degree phase shift implies only a 250 picosecond time difference at about 1 GHz frequency signal, but when down-converted to a 1 MHz frequency, the equivalent time difference is already 250 nanoseconds. The latter time difference can easily be measured.

Figure 1:
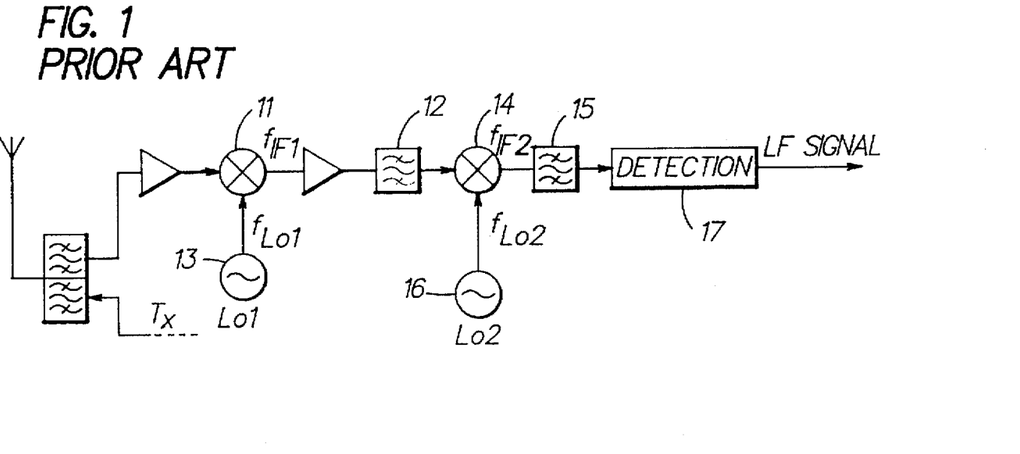
FIG. 1 is the prior art block diagram of a receiver.

FIG. 1 presents a conventional procedure for decreasing the frequency of a received radio frequency signal. The received signal $f_{RX}$ is carried through an antenna filter, a duplex filter when in a radio phone, and an amplifier to a multiplier 11. The carrier wave is multiplied therein with a fixed mixing frequency $f_{LO1}$ obtained from a local oscillator L01, and from among the mixing results thus obtained a desired intermediate frequency $f_{IF1}=f_{LO1}-f_{RX}$ is selected with a frequency domain filter 12. As regards the detection, it would be preferable to design the intermediate frequency $f_{IF1}$ to be low enough, but in radio apparatus currently used this cannot be done. The reason is that the input signal generally contains also such frequencies with which the other difference frequencies $f_{RX}-f_{LO}$ produced in the multiplier would pass onto the pass band frequency $f_{IF1}$ of the filter and would generate spurious response.

As an example thereof a radio phone with 935 to 970 MHz reception frequency range may be mentioned. The intermediate frequency $f_{IF1}$ should be higher than the input frequency range divided by two, that is 35 MHz/2, because otherwise in the reception, in the lower end of the reception frequency range and at 15 MHz intermediate frequency, and at 950 MHz local oscillator frequency $f_{LO}$, the apparatus would receive two outputs of different frequencies, that is, the desired $f_{RX}=935$ MHz, in which the following is valid:

$$f_{LO}-f_{RX}=950 \text{ MHz}-935 \text{ MHz}=15 \text{ MHz}$$

and a non-desired image frequency $f_{RX}=965$ MHz, in which the following is valid:

$$f_{RX}-f_{LO}=965 \text{ MHz}-950 \text{ MHz}=15 \text{ MHz}.$$

The elimination of a mirror-frequency reception therefore pre-requires that $f_{IF1}$ is in the upper half of the received frequency range. Moreover, when endeavors are made to keep $f_{LO}$ outside the RX band, in order to prevent the $f_{LO}$ from being coupled to the antenna, it follows that $f_{IF1}$ must be greater than the PX band, i.e. it should be typically 35-100 MHz. This is still a far too high a frequency for implementing the detection, and for that purpose, the frequency is again decreased. The selectivity required of a receiver is implemented with $f_{IF1}$ so that almost the only objective of the second mixing is the reduction of the frequency to be detected.

A method of converting a signal to another intermediate frequency known in the art is also shown in FIG. 1. Therein, a first intermediate signal $f_{IF1}$ and a second local oscillator signal $f_{LO2}$ received from a second local oscillator L02 are multiplied in multiplier 14, and the desired mixing result $f_{IF2}$ is selected with frequency domain filter 15. In block 17, the detection of the modulation is illustrated with a quadrature detector known in the art.

The greatest drawback of the design known in the art is the filter required after the multiplier, which using the prior art techniques cannot be integrated on the same chip, with the multiplier and the detector. The second drawback is the continuous power consumption of the linear multiplier.

BRIEF SUMMARY OF THE INVENTION

In a first aspect of the invention there is provided a method for producing a frequency difference signal between a modulated signal ($f_1$) and an unmodulated signal ($f_2$) while maintaining the information of the frequency or phase modulation, and for detecting the modulation from the frequency difference signal, characterized in that the time related order or sequence of arrival of the front or leading edges of the modulated and unmodulated signal is controlled, the edge of the output frequency difference signal is produced temporally at the time of the edge of such modulated signal when the order of arrival of the pulse edges of the modulating signal ($f_1$) and the unmodulated signal ($f_2$) has changed, whereby the frequency or phase shift of the modulated signal is detectable as a correspondent change in the frequency difference signal. The modulation of the frequency difference signal is detected on the basis of the time of the pulse edge of the frequency difference signal. In a second aspect of the invention there is provided a circuit arrangement for downmixing the modulated signal and for detecting the modulation. To a first input of the circuit is conducted a frequency or phase modulated first high frequency signal ($f_1$) and to a second input is conducted a second high frequency signal ($f_2$), this being unmodulated and from the output whereof the modulation information containing difference signal ($f_{out}$) of said frequencies is provided, characterized in that the circuit arrangement comprises first means for observing the time-related order of arrival of the leading edges of the pulses of a first and a second high-frequency signal, second means, being operatively connected to the first means and providing a pulse leading edge to the difference signal when ever the order of arrival of the leading edges of said input signal pulses changes, and third means to synchronize the leading edge of a pulse of the difference signal with the leading edge of a pulse of a first modulated high-frequency signal.

These have the advantage that the circuit arrangement implementing the method can be fabricated on a single semiconductor chip. Furthermore, direct detection of the modulating signal is possible at the same time as performing the down converting.

The input signals to the circuit arrangement accomplishing the downmixing in accordance with the method are the frequencies, and wherein the information is located in the pulse edges. One input signal $f_1$ can be a modulated signal and the other input signal $f_2$ can be a signal with a fixed frequency. The order of the leading edges of the pulses of the input signals are monitored and an output pulse generated whenever the arrival order of the information containing edges of the input signals changes. Such a change occurs when the number of the higher input frequency are greater by one than the number N of the cycle of the lower input frequency. In such instance, the following holds true:

$$\frac{N}{f_2} = \frac{N+1}{f_1} \quad (1)$$

resulting in a cycle count $$N = \frac{f_2}{f_1 - f_2} \quad (1a)$$

and in an output frequency:

$$f_{out} = \frac{f_2}{N} = f_1 - f_2. \quad (1b)$$

The selection of the output signal is so accomplished that the leading edges of the pulses become synchronized to the modulation containing signal. The above formulae are valid when no frequency or phase shift takes place in the input frequencies.

When a phase or frequency change takes place because of the modulation, the change is observable also in a low-frequency output signal $f_{out}$, from which it can be detected. Let us assume that at a point of time t=0 a signal $f_1$ has been modulated using a phase shift by moving the phase onwards by a phase length α. The new location of the edge is obtained by solving the following inequality.

$$\frac{N}{f_2} > \frac{N+1+\alpha}{f_1} \quad (2)$$

Solving for the changed cycle count N, whereafter the order of the pulse edges of the input signals changes:

$$N > (1+\alpha)\frac{f_2}{f_1 - f_2} \quad (3)$$

Respectively, after a modulation incident the edge of an output pulse will be at a point of time $$t_1 = \frac{(1+\alpha)}{f_1 - f_2} \quad (4)$$

It is found that the relative phase shift α of the output signal remains as a cycle lengthens since the frequency of the output signal is low, said temporal duration of the relative phase shift is sufficient to be detected.

In practice, N in a digital downmixing system based on pulse selection according to the invention is, however, a positive integer, so that respectively, the time shift of the mixing result to a relative phase shift of the input frequency of the order of α is $$\Delta T = \frac{INT\{N(\alpha)\} - INT\{N(O)\}}{f_1} + \frac{\alpha}{f_1} \quad (5)$$

where INT N (x) is the solution of equality (3) reduced to an integer. The greater the numbers N(α) and N(0), the smaller are the errors caused by rounding into an integer.

DESCRIPTION OF EMBODIMENT OF THE INVENTION

Figure 2:
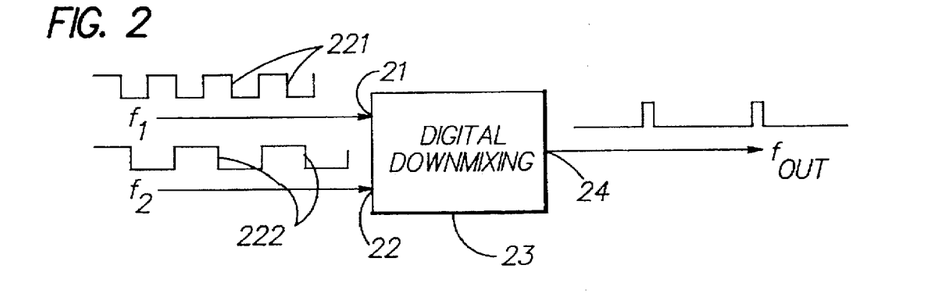
FIG. 2 presents a simplified block diagram of the frequency downmixer.
Figure 3A:
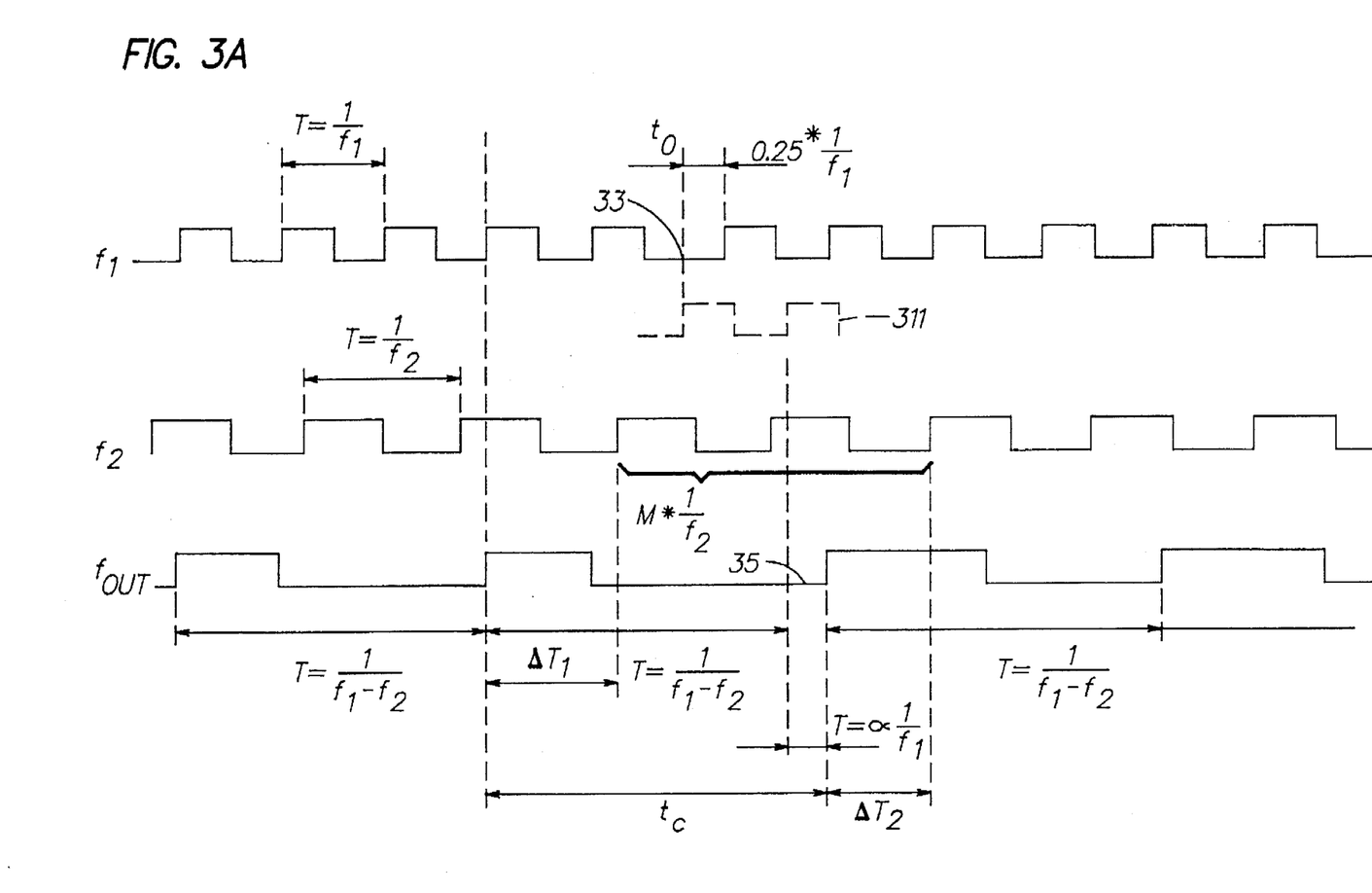
FIGS. 3A and 3B present pulse diagrams of the frequency downmixing.

FIG. 2 presents in simplified form the basic idea of the invention. The frequencies of the input signals entering the inputs 21 and 22 of a digital downmixer 23 are $f_1$ and $f_2$. It is assumed that $f_1$=45 MHz and $f_2$=44.55 MHz. The information contained therein is in a location of the edges of the pulse, to be more precise, in the changes of the front or leading edges thereof. The downmixer 23, a design thereof being described more in detail below, produces a pulse obtained from the output 24 to the output signal upon a change in the order of arrival of the information containing edges 221 and 222 of the input signals $f_1$ and $f_2$ to the downmixer 23. This is presented in the pulse diagram of FIG. 3A, where topmost is located the pulse diagram of the modulation containing signal $f_1$, in the middle an unmodulated frequency $f_2$ with a fixed frequency (local oscillator), and lowermost the output frequency $f_{out}$ of the downmixer. Thus, during the period between the pulses of the output signal $f_{out}$ the cycle count of a higher input frequency, frequency $f_1$ in FIG. 3A, is greater by one than the cycle count N of the lower frequency $f_2$. In such case, said formula (1) mentioned above is valid, and from formula (1a) for the cycle count N=99 is obtained, and from formula (1b) for the output frequency of the downmixer, $f_{out}$=450 kHz is obtained. In a manner typical of the downmixer 23 the selection of the output signal is accomplished so that the front edges of the pulses thereof become synchronized according to the modulation containing signal $f_1$. The location of the rear or trailing edges bear no significance.

At a point of time $t_0$ the signal $f_1$ is modulated by a 90 degree phase shift, i.e. the phase is shifted onwards by a length of 0.25 cycles, FIG. 3A. In the instance of the unmodulated signal, the output signal, after the point of time $t_0$, would have a subsequent edge after 99 cycles, as described above. In the instance of the modulated signal the location of the edge changes and the new location of the edge is provided as solution from the inequality (2) as presented above:

$$\frac{N}{f_2} > \frac{N+1+\alpha}{f_1}$$

The order of arrival of the pulse edges changes again when N pieces of $f_2$ pulses have passed, i.e. the following condition of formula (3) is valid for N:

$$N > (1+\alpha)*f_2/f_1 - f_2 = 1.25*99 = 123.75$$

Respectively, the edge of a first output pulse after the modulation incident enters according to formula (4) at a point of time $$t_1 = \frac{(1+\alpha)}{f_1 - f_2} = 2.77 \text{ microseconds}.$$

The phase modulation in signal $f_1$ thus results in the output signal a relative phase shift of equal size in the form of cycle lengths, that is, 0.25 in the present instance.

As stated above, the relative phase shift in the input frequency results in a relative phase shift of equal magnitude into the mixing result. In practice, in digital downmixing based on pulse selection, the number N is, however, a positive integer, respectively, the time shift of the mixing result for a relative phase shift of input frequency of the order of $\alpha$ is $$\Delta T = (INT\{N(\alpha)\} - INT\{N(O)\})/f_1 + \alpha/f_1.$$

where INT $\{N(x)\}$ refers to the solution of formula (3) reduced into an integer. The greater the numbers $N(\alpha)$ and $N(O)$ are, the smaller are the errors due to the rounding into an integer.

Figure 3B:
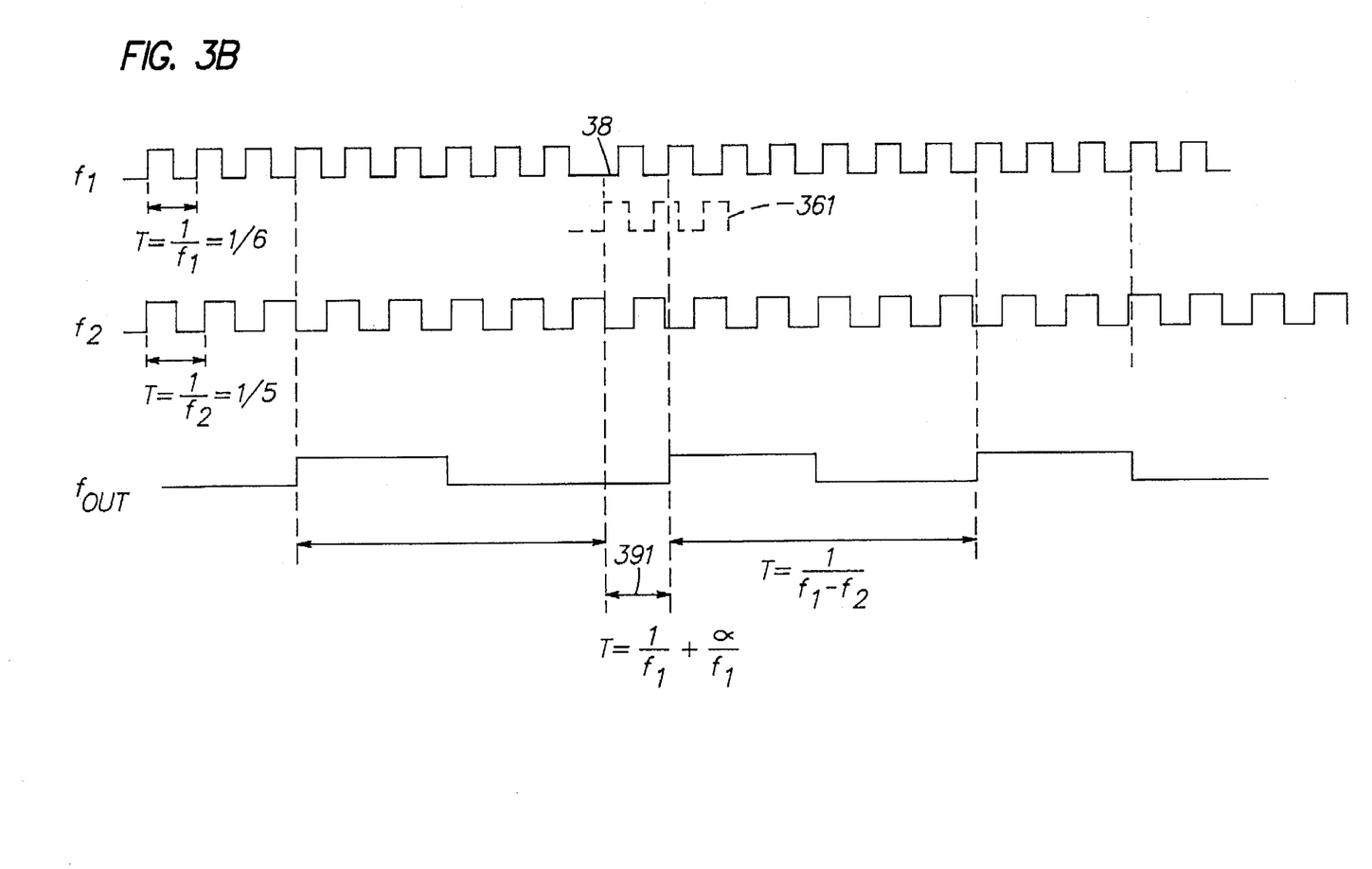

Next, reference is made to FIGS. 3A and 3B, on the basis whereof the production and significance of the rounding error are described. The relative frequency $f_1$ of the modulated input signal is 3 and the relative frequency $f_2$ of the unmodulated mixing signal is 2. The magnitude of the phase modulation 33 of $f_1$ taking place at a point of time $t_0$ is, according to what is stated above, 0.25 cycle lengths, that is 90 degrees, thus $\alpha=0.25$. The broken line 311 shows, as a demonstration, part of the input signal $f_1$ in a case that no modulation would had taken place. At said numeric values according to formula (3) $N(\alpha)=2.5$ and $N(0)=2$, i.e. in a downmixing based on pulse selection, only the latter term thereof $\alpha/f_1$, that is, the original time related delay of the input signal pulse edge is visible according to formula (5) as a relative phase delay of the output signal. In the output signal $f_{out}$ (lowermost signal) of FIG. 3A the delay 35 of the pulse edge caused by modulation is precisely of the size of that calculated above.

FIG. 3B presents a case in which the relative frequencies of the input signals have been raised to values $f_1=6$ and $f_2=5$, whereby the difference frequency is still 1. The size $\alpha$ of the modulating phase step is here also 0.25 of the sequence length as the reference numeral 38 refers. The broken line represents the input signal $f_1$ in an instance in which no phase modulation had taken place. At said numeric values $N(\alpha)=6.25$ and $N(O)=5$, when the pulse edge of the output signal $f_{out}$ shifts according to formula (5), continuing because of the modulation by the time $$\Delta T = 1/f_1 + \alpha/f_1$$

i.e. by 1.25 of the cycle length of $f_1$, which can be seen as time interval 391 in FIG. 3B.

On the basis of the above description related to the rounding error it is obvious that the phase and frequency resolution of the downmixing method is limited and that the essential source of errors, as regards the method, is the detection of the pulse edge by means of the cycles either too early or too late. On the other hand, when the modulation is narrow-banded, the frequencies $f_1$ and $f_2$ can be selected so that the defective or missing pulse edges can be localized and either rejected or corrected afterwards, for instance so that the point of time of the pulse edges in a desired time window is stored in the memory. As is described below, when the intermediate frequency of an analog radio phone 45 MHz is mixed to 450 kHz frequency with the aid of 44.55 MHz mixing frequency, it is found that the correct pulse edge is located 97 to 100 cycle times of $f_2$ frequency after the preceding pulse edge. Using the modern time interval measurement technique, such a circuit can be implemented which detects the pulse edge of the input frequency $f_1$, with the distance to the shortest distance pulse edge of the $f_2$ thus finding a value rounded to the nearest integer to numeral INT $\{N(\alpha)\} - INT\{N(O)\}$.

The cycle length of an output signal produced as a result of the downmixing can be measured in conjunction with the downmixing illustrated for the detection by measuring the relative location of the pulse edges of the output signal with respect to the pulse edges of a fixed mixing frequency $f_2$. Reference is still made to FIG. 3A. At the modulation, the interval of an output signal pulse lengthens, its sequence length $t_c$ being then $$t_c = M*1/f_2 + \Delta T_1 - \Delta T_2$$

where $\Delta T_1$ is the distance of the front edge of the detected output pulse from the edge of a subsequent $f_2$ and $\Delta T_2$ the distance of a subsequent output pulse from the edge of $f_2$ thereafter, and M refers to the number of the whole cycles remaining between said edges of $f_2$. Thus, $\Delta T_1$ is the time interval of the pulse edges of $f_1$ and $f_2$ when the pulses reach each other again. The measurement method of said short periods is known in the art and one of the methods for measuring $\Delta T_1$ and $\Delta T_2$ is disclosed in Finnish patent application FI-896267, which corresponds to U.S. Pat. No. 5,270,666 by J. Rapeli et al., the disclosure of which is incorporated by reference herein in its entirety.

Figure 4A:
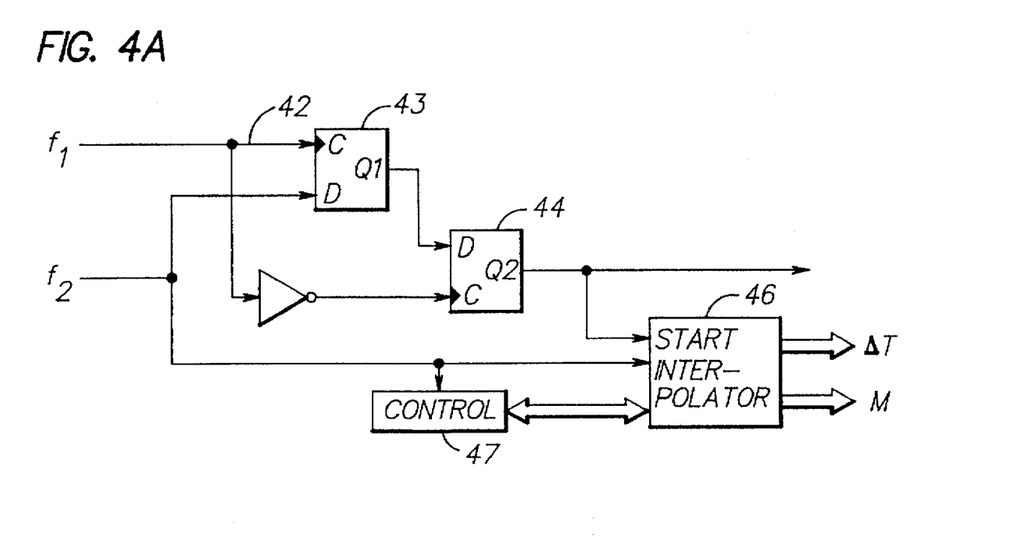
FIG. 4A is a circuit diagram of a design implementing the invention.

The downmixing using digital pulse selection according to the invention can be accomplished advantageously by means of a circuit comprising logical gates as those shown in FIG. 4A. The pulse diagram of the circuit is presented in FIG. 4B. From an unmodulated input signal $f_2$ connected to data input D samples are taken by means of D flip-flop 43 controlled by a modulated input signal 42 coupled to the clock input, whereby the output of the D flip-flop shifts its state every time at the pulse edge of a modulated signal. Hereby, the rising edge of a pulse is shown in the output whenever the leading edge of the signal reaches the clock signal.

A known drawback of the circuit is only the growth of the delay of the D flip-flop 43 when the rising edges of the clock and data inputs approach to a distance of only pico-seconds from each other. In order to eliminate said timing uncertainty, the output is triggered on the falling edge of $f_1$ by one half sequence length later with another D flip-flop 44. The circuit is reliable in operation even if the input signals were highly asymmetric.

Figure 4B:
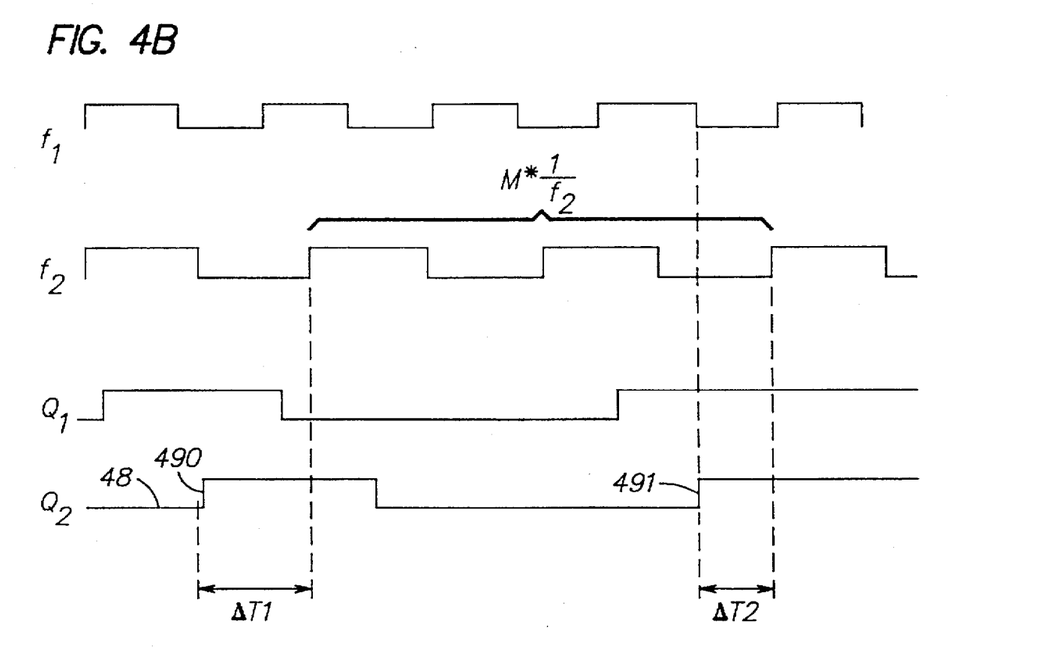
FIG. 4B shows the pulse diagram of the design.

If one wants to measure the time intervals $\Delta T_1$ and $\Delta T_2$ for detection, it is accomplished with interpolator 46 so that the rising edge 490 of the output signal, presented in FIG. 4B by line 48, starts the interpolator 46 by calculating the fractions of the cycle length and the subsequent rising edge of frequency $f_2$ stops it, whereafter the interpolator starts the calculation of the whole pulses of the control part 47, permitted by $f_2$ until a subsequent acceptable pulse edge 491 of difference frequency enters the interpolator and starts the measurement of fraction $\Delta T_2$ of the sequence length and discontinuing the counting of the number N of the whole pulses. Said interpolator is known in the art, and one such is described in the above mentioned Finnish patent application FI-896267 corresponding to U.S. Pat. No. 5,270,666.

Figure 5A:
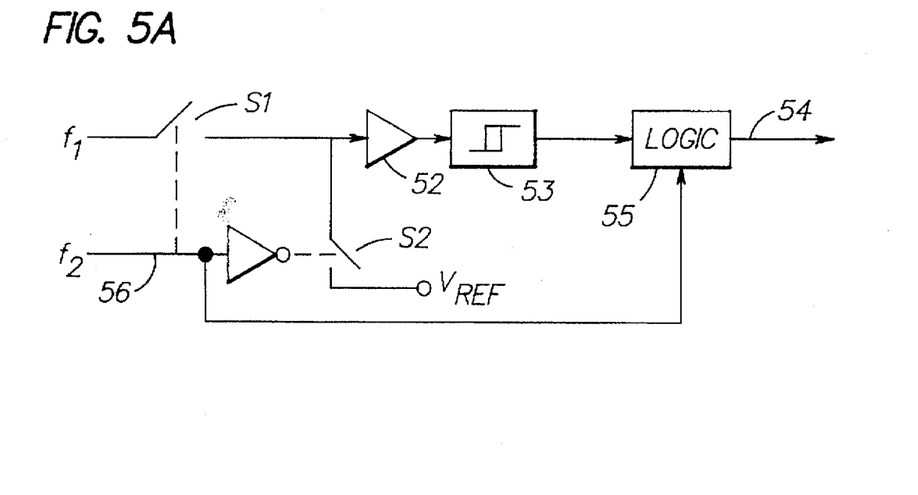
FIG. 5A presents an implementation of the invention.
Figure 5B:
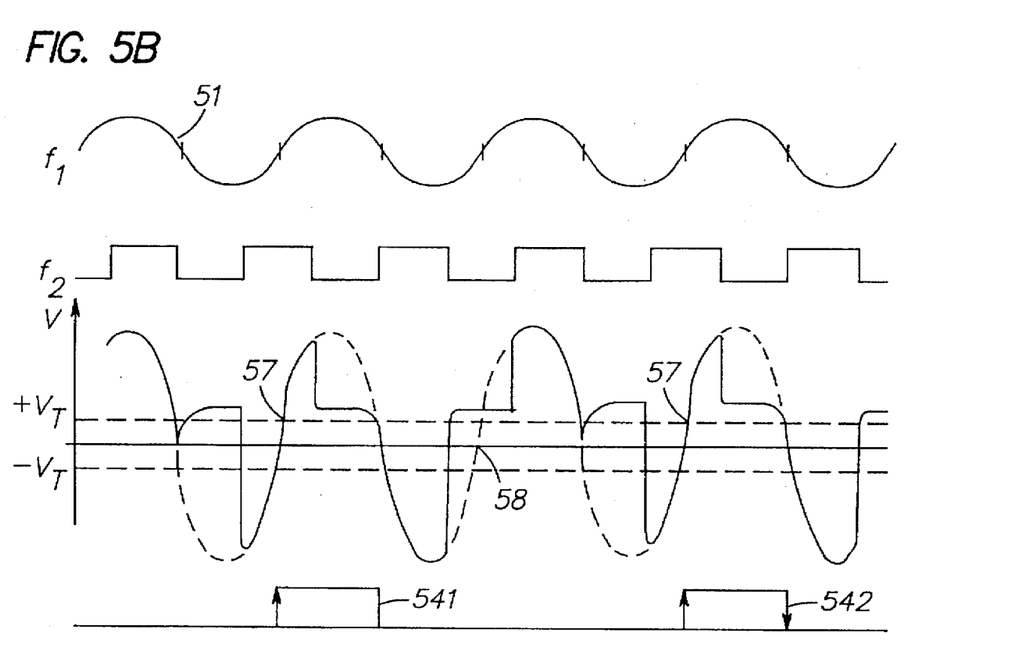
FIG. 5B shows the pulse diagram thereof.

FIG. 5A presents a second embodiment of the downmixer, and FIG. 5B the pulse diagram thereof. Since the unmodulated mixing frequency $f_2$ is already of logical level in the form of point frequency, it is preferable to use a reverse embodiment, in which the sampling is controlled with the aid of an unmodulated mixing frequency and in which the location of the pulse edge is determined by the amplification of the amplifier chain 52 and by the level of comparison of comparator 53. A relative change of location of the edge of the output signal 54 compared with a preceding one is determined by a change in the edge of the modulated input signal 51 because during the interval between the pulses 541, 542, the amplification of the amplifier chain 52, the amplitude of the modulated input signal 51, and the level of comparison of the comparator remain constant. The amplifier 52 may also be an integrator or a derivator, or an amplifier controlled automatically according to the level (e.g. AGC amplifier). The function of the logical block 55 is to select the signal for the output signal from each sampling interval in which a change either in a positive or negative direction occurs first.

The circuit of FIG. 5A operates so that the rising edge of the output signal 54 is detected only when a signal entering the comparator exceeds the triggering threshold of the comparator in the course of the positive sequence of the clock signal f2 in FIG. 5B illustrated by points 57. An equivalent exceeding of the triggering threshold during the negative edge of the clock signal $f_2$, point 58, is blocked by means of logical operations and by placing $V_{ref}$ for the level of the input signal, this being higher in voltage than the threshold level $+V_T$ required by the mode shift of the comparator. Thus, the level of the desired signal need not be amplified into a continuous, logical level pulse sequence, instead, only the local frequency $f_2$ and the output pulse 54 of the circuit would be of logical level. By this aspect, the power consumption of the circuit shown in FIG. 5A and radio frequency interferences caused by logical level signals are reduced to be as small as possible.

Stated another way, in the circuit arrangement that is described in FIG. 5A samples are taken from the modulated signal $f_1$ on a positive half cycle. These samples are input to the amplifier chain (52,53). On a negative half cycle a constant voltage $V_{ref}$ is input to the amplifier/comparator-chain. The output voltage of the amplifier (52) is shown in FIG. 5B. The trigger levels $+V_T$ and $-V_T$ of the comparator (53) are shown in the coordinates describing the output voltage signal. The fourth line of FIG. 5B describes the output of the logic block (55), this output being the frequency difference signal from which the modulation can be detected. The logic is controlled by the clock signal $f_2$.

With the circuit of the invention, a remarkable saving can be achieved in the power consumption of a radio frequency device. Since in the radio systems, the greatest frequency deviation of the frequency modulation and in the phase modulations, the greatest phase shift speed are predefined quantities in the art, the operation of the downmixer can after each change in the state be discontinued for so long that the entry of a new change of state, that is, of an information containing edge of the output signal is again expected. Therefore, the active operating time of the mixer can be made short in duration and the power consumption reduced to a fraction of the power consumption of a continuous-operating mixer.

This may be demonstrated with an example. Let us assume that the signal frequency $f_1$=45 MHz, mixing frequency $f_2$=44.55 MHz and the greatest bandwidth of frequency modulation ±4 kHz. For a deviation corresponding to the extreme case of the modulation the time $t_e$ for the earliest possible point of time can be calculated in the course of which $f_2$ has propagated by n cycle length, that is, $t_e = n/f_2 < (n+1)/f_1$, from which is obtained $n = f_2/(f_1 - f_2)$ and $t_e = 1/(f_1 - f_2 \text{ max})$.

For the numeric value, $t_e$=2.18 μs, or 97 $f_2$ frequency pulses are obtained. During said 97 pulses, it is often more preferable to keep logical level counters operating at $f_2$ frequency in operation than the pulse processing circuits amplifying and comparing the modulated signal, the power consumption whereof being much greater than the logic operating at the same frequency.

Figure 6:
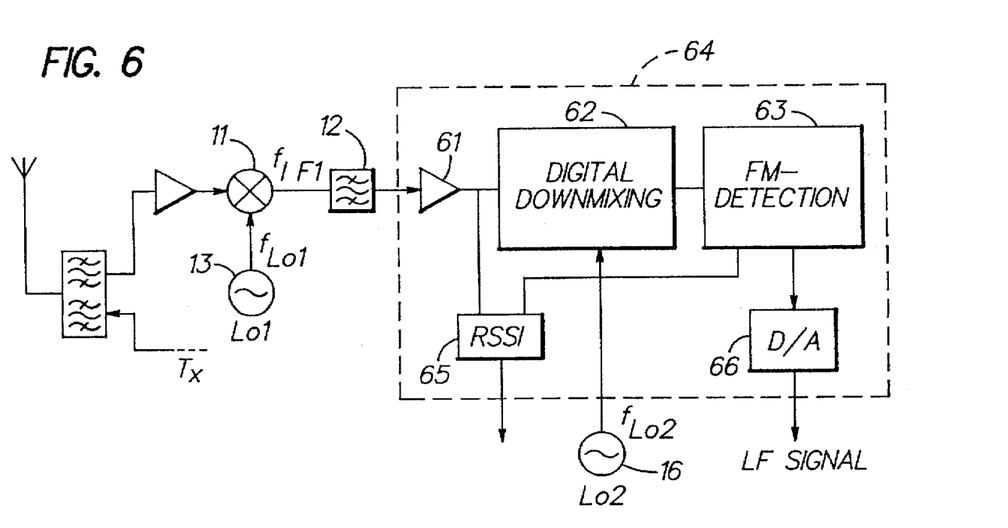
FIG. 6 is the block diagram of a FM receiver utilizing the invention.

The downmixing of the present invention leads to an FM/PM receiver structure advantageous with a view of the filtering of the frequency domain, and employing only one intermediate frequency, shown in FIG. 6. Therein a first intermediate frequency $f_{IF1}$ is produced similarly as in FIG. 1, but thereafter the signal with $f_{IF1}$ frequency is amplified with an amplifier 61 for making feasible the logical level signal processing, the digital downmixing according to the principle described in the foregoing is carried out in means 62 and combined therewith, the detection of FM or PM modulation in detector 63 based on pulse time interval measurement. In addition, with the operations of the circuit defined by broken line 64 a detection 65 of the strength of the entering signal has been added and conversion of the modulation detected in digital form into analog voltage by a digital/analog (D/A) converter 66. The comparison of FIGS. 1 and 6 shows clearly the advantages achieved with the invention.

Owing to the non-ideality and digitality of the method and the circuits, the main source of errors is the timing of the pulse edge of the output signal occurring earlier or later by the amount of one or more whole cycles than what the proper location would be. It is possible to show that this is equivalent to the natural noise of the signal and that the signal noise ratio of the detected signal deteriorates for that reason only insignificantly.

The downmixing principle described above is, in fact, equivalent to the downmixing based on analog multiplication, only with the difference, that selecting a right output signal is carried out by selection in the time domain and not by filtering in the frequency domain as in using an analog multiplier. The design according to the method described above is simple to carry out in the form of an integrated circuit and is therefore non-costly. The only drawback of the method is that the frequency band of the input signals must be limited.

The method can be advantageously used for instance to detect the digital modulation in the radio phone system or in the coaxial cable system so that the downmixing is carried out based on pulse selection, and the actual detection based on the measurement of the time interval of the pulses obtained as a result. The invention is particularly advantageous to carry out using a logic in which the signal levels are very low.

The above description has been drawn using the radiophone as an example and as an application. On the basis of the description, the invention may, however, be applicable to a variety of detection and measurement purposes and the protective scope is limited only by the accompanying claims.

What is claimed is:

1. A method for producing a frequency difference signal between a modulated signal ($f_1$) and an unmodulated signal ($f_2$) while maintaining information conveyed by a frequency or phase modulation of the modulated signal, and for detecting the modulation from the frequency difference signal, comprising the steps of:

monitoring a time-related order of arrival of leading edges of pulses of the modulated and unmodulated signal;

generating the frequency difference signal such that edges of the frequency difference signal correspond temporally to those edges of the modulated signal whereat the monitored time-related order of arrival of the leading edges of the modulating signal ($f_1$) and the unmodulated signal ($f_2$) are found to change,     whereby the frequency or phase shift of the modulated signal is detectable as a correspondent change in the frequency difference signal, and     detecting the modulation of the frequency difference signal on the basis of the locations of the pulse edges of the frequency difference signal.

2. A method according to claim 1, characterized in that the frequency difference signal is produced by taking samples controlled by the modulated signal ($f_1$) from the unmodulated frequency ($f_2$) and by selecting a first sample with a reversed sign as an output.

3. A method according to claim 1, characterized in that for the pulse edge of the frequency difference signal, the pulse edge of the modulated input signal ($f_1$) is selected which is closest in time to the respective edge of the unmodulated signal ($f_2$).

4. A method according to claim 1, characterized in that as a cycle length of the frequency difference signal changes, a relative location of the pulse edges of the frequency difference signal is measured with respect to the pulse edges of the unmodulated signal ($f_2$) and the cycle length ($t_c$) is calculated using the following formula:

$$t_c = M * 1/f_2 + \Delta T_1 - \Delta T_2$$

where $\Delta T_1$ refers to a time difference of the leading edge of the detected output pulse from the subsequent pulse edge of the unmodulated signal ($f_2$), $\Delta T_2$ refers to a time difference of the subsequent detected output pulse from the pulse edge of the unmodulated signal ($f_2$) occurring thereafter, and M refers to a number of whole cycles of the unmodulated signal between the pulse edges.

5. A circuit for downmixing a modulated signal and for detecting information conveyed by said modulated signal, said circuit having a first input coupled to a frequency or phase modulated first high-frequency signal ($f_1$) and a second input coupled to an unmodulated second high-frequency signal ($f_2$), said circuit further having an output terminal for outputting a difference signal ($f_{out}$) expressive of a difference in frequency between said first and second signals and containing the modulation information, said circuit comprising:

a clocked logic circuit having inputs coupled to $f_1$ and $f_2$ for monitoring an order of arrival of leading edges of pulses representing the first and the second high-frequency signals     and for generating a leading pulse edge in said difference signal whenever a change occurs in the order of arrival of the leading edges of said first and second signals; and     said clocked logic circuit synchronizing the leading edge of a pulse of the difference signal with the leading edge of a pulse of the modulated first high-frequency signal.

6. A circuit according to claim 5, wherein said clocked logic circuit is comprised of a flip-flop having a clock input terminal coupled to the modulated first high-frequency signal ($f_1$), a data input terminal coupled to the second high-frequency signal ($f_2$), and a data output terminal that outputs a first difference signal expressive of a difference between said first and second high frequency signals.

7. A circuit according to claim 6, wherein said clocked logic circuit further comprises a second flip-flop having a clock input terminal coupled to the clock input terminal of the first flip-flop through an inverter, a data input terminal coupled to the data output terminal of the first flip-flop, and a data output terminal that outputs a second difference signal expressive of a difference between said first high frequency signal and said first difference signal.

8. A circuit according to claim 7, and further comprising an interpolator means for determining fractional parts of a cycle, said interpolator means having a first input coupled to said second difference signal and a second input coupled to said second high frequency signal, said interpolator means being responsive to a change in a cycle length of the second difference signal for determining a relative location of the pulse edges of the second difference signal with respect to the pulse edges of the unmodulated signal ($f_2$), wherein the cycle length ($t_c$) is calculated using the following formula:

$$t_c = M * 1/f_2 + \Delta T_1 - \Delta T_2$$

where $\Delta T_1$ refers to a time difference of the leading edge of the detected output pulse from the subsequent pulse edge of the unmodulated signal ($f_2$), $\Delta T_2$ refers to a time difference of a subsequent detected output pulse from the pulse edge of the unmodulated signal ($f_2$) occurring thereafter, and M refers to a number of whole cycles of the unmodulated signal $f_2$ between the pulse edges.

9. A circuit according to claim 5, wherein with the exception of a basic clock frequency of the circuit, all circuit activities are discontinued starting from a detected pulse edge and for a period of time which is a function of the bandwidth of the modulated signal until a re-occurrence of a new pulse edge at the difference frequency is imminent, thereby reducing an operation power requirement of said circuit.

10. A method for producing a frequency difference signal between a modulated signal ($f_1$) and an unmodulated signal ($f_2$), comprising the steps of:

monitoring an arrival sequence of pulses of the modulated and the unmodulated signals; and     generating a pulse of the frequency difference signal substantially contemporaneously with a pulse of a respective one of the modulated signal or unmodulated signal when the step of monitoring indicates that the arrival sequence changes, whereby the frequency or phase shift of the modulated signal is detectable as a corresponding change in the frequency difference signal.

11. A method according to claim 10, wherein the frequency or phase shift of the modulated signal is detected from the frequency difference signal by monitoring the disposition of pulses in the frequency difference signal.

12. A circuit for down converting a modulated signal and for detecting the modulation of the modulated signal, said circuit having a first input coupled to a frequency or phase modulated first high-frequency signal ($f_1$) and a second input coupled to an unmodulated second high-frequency signal ($f_2$), said circuit further having an output terminal for outputting a frequency difference signal ($f_{out}$) expressive of a difference in frequency between said first and second signals and containing the modulation information, said circuit comprising:

a clocked logic circuit having inputs coupled to $f_1$ and $f_2$ for monitoring an arrival sequence of pulses of the first and second high-frequency signals;

for generating a pulse of the frequency difference signal substantially contemporaneously with a pulse of a respective one of the modulated signal or unmodulated signal when it is indicated that the arrival sequence changes, whereby the frequency or phase shift of the modulated signal is detectable as a corresponding change in the frequency difference signal; and said clocked logic circuit synchronizing the pulse of the difference signal with the pulse of a respective one of the high frequency signals.

13. Apparatus for producing a frequency difference signal between a modulated signal ($f_1$) and an unmodulated signal ($f_2$), comprising:

a circuit coupled to $f_1$ and $f_2$ for monitoring an arrival sequence of edges of the modulated and the unmodulated signals and for generating a pulse of the frequency difference signal substantially contemporaneously with an edge of a respective one of the modulated signal or unmodulated signal when it is indicated that the arrival sequence changes, whereby the frequency or phase shift of $f_1$ is detectable as a corresponding change in the frequency difference signal.

14. Apparatus according to claim 13, wherein the frequency or phase shift of $f_1$ is detected from the frequency difference signal by monitoring the disposition of pulses in the frequency difference signal.

15. Apparatus according to claim 13, wherein said circuit is comprised of a first flip-flop having a clock input terminal coupled to $f_1$, a data input terminal coupled to $f_2$, and a data output terminal that outputs a first difference signal expressive of a difference between $f_1$ and $f_2$.

16. Apparatus according to claim 15, wherein said circuit further comprises a second flip-flop having a clock input terminal coupled to an inverse of $f_1$, a data input terminal coupled to the data output terminal of the first flip-flop, and a data output terminal that outputs a second difference signal expressive of a difference between $f_1$ and said first difference signal.

17. Apparatus according to claim 13, wherein said circuit comprises:

a first switch coupled between $f_1$ and an input of an amplifier means, said amplifier means having an output coupled to an input of a comparator, and a second switch coupled between $f_1$ and a voltage ($V_{ref}$), wherein an open and closed state of said first switch is controlled by an amplitude level of $f_2$, wherein an open and closed state of said second switch is controlled by an inverse of the amplitude level of $f_2$;

wherein for monitoring the order of arrival of leading edges of $f_1$ and $f_2$, information of the order of arrival of leading edges of $f_1$ and $f_2$ is included in an output of said comparator, and further comprising a logic block having a first input coupled to said output of said comparator and a second input coupled to $f_2$ for generating said frequency difference signal at an output.

* * * * *